United States Patent
Takemori (10) Patent No.: US 7,788,822 B2
(45) Date of Patent: Sep. 7, 2010

(54) DRYING APPARATUS

(75) Inventor: Toshinori Takemori, Toshima-Ku (JP)

(73) Assignee: Kyowa Kako Co., Ltd., Tokyo (JP)

( * ) Notice: Subject to any disclaimer, the term of this patent is extended or adjusted under 35 U.S.C. 154(b) by 0 days.

(21) Appl. No.: 11/975,570

(22) Filed: Oct. 19, 2007

(65) Prior Publication Data

US 2008/0052949 A1 Mar. 6, 2008

Related U.S. Application Data

(63) Continuation of application No. PCT/JP2006/306672, filed on Mar. 30, 2006.

(30) Foreign Application Priority Data

Apr. 20, 2005 (JP) ............................. 2005-122555

(51) Int. Cl.
*F26B 3/00* (2006.01)
*F26B 13/00* (2006.01)

(52) U.S. Cl. ............................. 34/643; 34/644; 34/655; 34/656; 34/222; 34/229

(58) Field of Classification Search ................... 34/643, 34/644, 655, 656, 218, 222, 224, 229, 232
See application file for complete search history.

(56) References Cited

U.S. PATENT DOCUMENTS

| 4,292,745 | A | * | 10/1981 | Caratsch | 34/644 |
| 4,887,365 | A | * | 12/1989 | Oda | 34/60 |
| 5,976,256 | A | * | 11/1999 | Kawano | 118/684 |
| 6,421,932 | B2 | * | 7/2002 | Gommori et al. | 34/488 |
| 2001/0014542 | A1 | * | 8/2001 | Kondo et al. | 438/755 |

FOREIGN PATENT DOCUMENTS

| JP | 62-81718 | 4/1987 |
| JP | 2-152501 | 6/1990 |
| JP | 5-36660 | 2/1993 |
| JP | 09-113138 | 5/1997 |
| JP | 10-170901 | 6/1998 |
| JP | 11-316084 | 11/1999 |
| JP | 2003-240435 | 8/2003 |

* cited by examiner

*Primary Examiner*—Jiping Lu
(74) *Attorney, Agent, or Firm*—Cohen Pontani Lieberman & Pavane LLP (57) ABSTRACT

Disclosed is a drying apparatus equipped with linear drive mechanisms to drive spray nozzles in the direction perpendicular to the direction in which a wet object is transferred in the drying box. Each spray nozzle has a long discharge slit elongated in the direction in which the wet object is transferred. Two opposed nozzles are provided at each of the entrance and exit of the drying box. Each nozzle has an elongated slit traversing the width of the wet object in the direction perpendicular to the transporting direction, the opposed surfaces of the nozzles being so inwardly oblique that the gap between the opposed surfaces is larger at the inner edge than the outer edge.

8 Claims, 9 Drawing Sheets

DRYING APPARATUS

RELATED APPLICATION

This application is a U.S. Continuation Application of International Application PCT/JP2006/306672 filed Mar. 30, 2006.

TECHNICAL FIELD

The present invention relates to a drying apparatus, and particularly to a drying apparatus appropriate for use in quickly drying wet objects such as liquid crystal panels or printed circuit boards washed with a liquid in the course of manufacturing liquid crystal displays or semiconductor devices.

BACKGROUND ART

What is most necessary for quickly drying wet objects such as liquid crystal panels or printed circuit boards is to attain positive dewatering and quick drying subsequent to dewatering. A conventional drying apparatus has a dewatering compartment positioned ahead of an ultra drying compartment. The dewatering compartment is equipped with opposed air jet nozzles, which are obliquely directed at the entrance to produce an air component flowing in the counter direction to the direction in which wet objects are transferred, thereby improving the dewatering efficiency and at the same time, preventing invasion of the air from the dewatering compartment to the adjacent ultra drying compartment. In the ultra drying compartment, opposed dry air jet nozzles are arranged perpendicular to the direction in which wet objects are transferred, thus reducing the disturbance in the inner atmosphere to possible minimum, and at the same time, preventing invasion of the surrounding air into the clean ambient atmosphere of the ultra drying compartment (see Patent Document 1)

Another conventional drying apparatus has a drying box in which opposed dry air discharging nozzles are arranged in vertical direction relative to a wet object. The drying box has no opening to communicate with the surrounding air except for its entrance and exit. The entrance or exit is small enough to keep the inner drying space positive in pressure with the dry air blown from the nozzles. When the dry air from the nozzles hits the wet object, the dry air disperses in all directions and flows out from the entrance and exit. Thus, invasion of the surrounding air into the drying box is effectively prevented, keeping the inside of the drying box in predetermined drying condition. Each nozzle is adapted to move from side to side with respect to the vertical position, in which the dry air vertically blows toward the wet object. The drying apparatus has opposed dewatering air slits somewhat inclined in the counter direction opposite to the direction in which a wet object is transferred, thereby making the dry air push the liquid remaining on the wet object backward for dewatering (see Patent Document 2).

Patent Document 1: Patent Application Laid-Open No. 2003-240435

Patent Document 2: Patent Application Laid-Open No. H11-316084

DISCLOSURE OF THE INVENTION

In such conventional drying apparatuses, the drying nozzle is arranged vertically relative to the direction in which a wet object is transferred so that the dry air blows vertically to the wet object. Therefore, when the dry air hits the wet object, the dry air disperses in all directions and flows out of the drying box through its entrance and exit. Thus, the liquid can be completely removed from the surface of the wet object. Also, the dewatering slit is arranged to be somewhat oblique relative to the direction in which the wet object is transferred so that the liquid on the surface of the wet object is pushed backward to attain the positive dewatering from the surface of the wet object.

In the conventional drying apparatuses, however, the drying nozzle or dewatering air slit is very short, 0.1 mm to 0.2 mm long, and therefore, the dry air cannot fully meet the side faces of the wet object while moving on the transportation passage, and consequently the dewatering and drying of the side faces of the wet object is not satisfactory. As a matter of fact, the remaining water is pushed away from the major flat surface toward the edges of the wet object by the dispersing and sweeping air from the nozzle and dewatering slit, and finally the remaining water comes around the edges and stays on the side faces of the wet object. This problem increases noticeably more and more with the increase of the thickness of the wet object.

Figure 10:
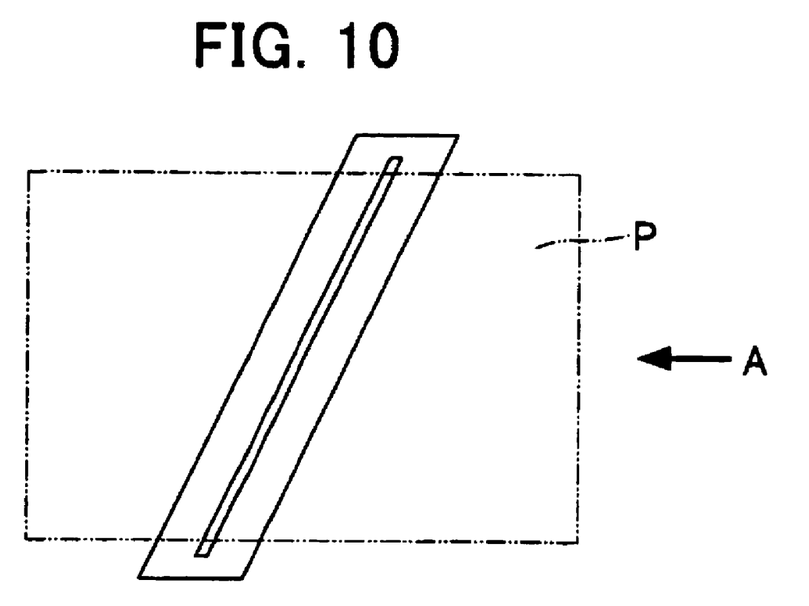
FIG. 10 diagrammatically shows a conventional dewatering slit.
Figure 11:
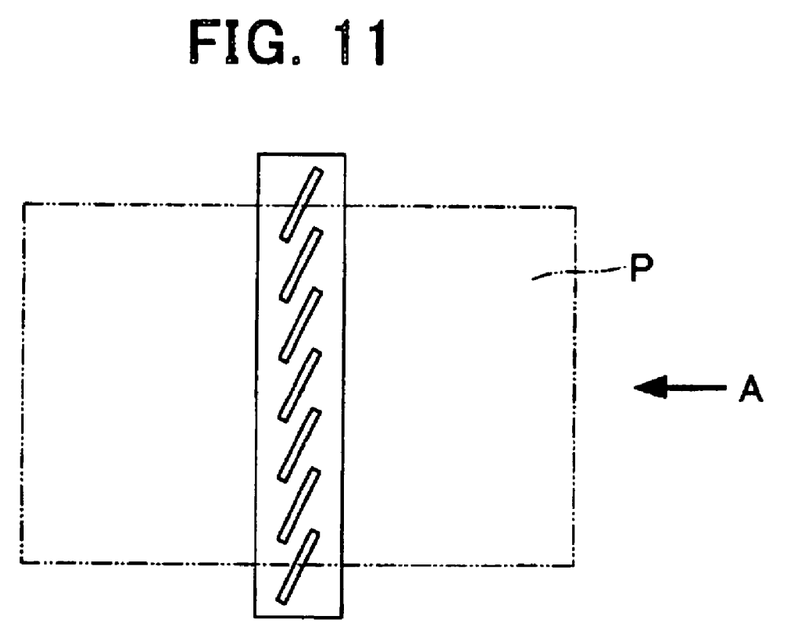
FIG. 11 diagrammatically shows another conventional dewatering slit assembly.

Positioning a dewatering compartment ahead of the drying compartment makes the drying apparatus large in size. Using the swaying nozzle movable from side to side relative to the transportation passage of the wet object causes a disadvantage of making the distance between the wet object and the nozzle vary with the instantaneous swaying amplitude of the nozzle, resulting in uneven drying of the surface of the wet object. As for other conventional arrangements, an elongated slit is arranged oblique to the direction in which a relatively thick wet object P is transferred (indicated by arrow A) as seen from FIG. 10. Otherwise, a plurality of relatively short slits are aligned so as to be perpendicular to the direction in which a wet object P is transferred (indicated by arrow A), each short slit being inclined oblique relative to the direction "A" as seen from FIG. 11. These arrangements require a relatively large space, and a sufficient amount of air cannot hit the side surfaces of the wet object, and therefore, the dewatering is not satisfactory.

The object of the present invention is to provide a compact drying apparatus capable of dewatering and drying the whole surface of a wet object including the side faces.

MEANS FOR SOLVING THE PROBLEM

To attain this object, the present invention provides a drying apparatus comprising a hermetically sealed drying box positioned in the transportation passage on which a wet object is transferred after being washed with a liquid, the drying box having an entrance and an exit to allow the wet object to enter and leave the drying box, and dry air discharge means for blowing and directing dry air at the wet object traveling on the transportation passage, the drying apparatus being characterized in further comprising means for moving the dry air discharge means rectilinearly in a direction perpendicular to the transporting direction in which the wet object is transferred, the discharge port of the dry air discharge means being provided in the form of long slit elongated in the transporting direction.

According to the present invention, the dry air discharge means may comprise a plurality of nozzles arranged in line in the direction perpendicular to the transporting direction.

According to the present invention, the dry air discharge means may comprise a plurality of arrays of nozzles arranged in the transporting direction, each array of nozzles comprising a plurality of nozzles arranged in line in the direction perpendicular to the transporting direction.

According to the present invention, the dry air discharge means may be arranged above and below the wet object on the transportation passage to sandwich the wet object therebetween.

According to the present invention, the drying apparatus may further comprise a second dry air discharge means positioned at the entrance and the exit of the drying box, comprising a pair of opposed nozzles each having an elongated slit traversing at least the width of the wet object in the direction perpendicular to the transporting direction, the opposed surfaces of the nozzles being so inwardly oblique that the gap between the opposed surfaces is larger at the inner edge than the outer edge.

According to the present invention, a drying apparatus may further comprise a third dry air discharge means to fill the drying box with dry air, the third dry air discharge means having its discharge port directed at the means for moving the dry air discharge means rectilinearly.

According to the present invention, the means for moving the dry air discharge means rectilinearly may comprise a linear driving mechanism.

EFFECT OF THE INVENTION

According to the present invention, the dry air discharge means is adapted to move in the direction perpendicular to the direction in which the wet object is transferred, thus making it unnecessary to arrange the dry air discharge means across the full width of the wet object, and accordingly the whole size of the drying apparatus can be reduced. Also, the distance between the dry air discharge means and the surface of the wet object remains constant, and therefore, the wet object can be dried evenly. Still advantageously, the slit of the dry air discharge means is elongated in the direction in which the wet object is transferred, thereby permitting the dry air to hit the side faces of the wet object without fail, even if the wet object is thick, thus attaining the complete dewatering and drying of not only the opposite major surfaces but also the side faces at the same time.

According to the present invention, the dry air discharge means is arranged vertically to sandwich the wet object. Otherwise, a plurality of nozzles are aligned in line in the direction perpendicular to the direction in which the wet object is transferred, or a plurality of arrays of nozzles are arranged in the transporting direction, each array of nozzles comprising a plurality of nozzles arranged in line in the direction perpendicular to the transporting direction. With this arrangement, the drying efficiency can be controlled in respect of the size of the wet object or the desired drying speed.

According to the present invention, the second dry air discharge means is positioned at the entrance and exit of the drying box. Specifically the second dry air discharge means comprises a pair of opposed nozzles, each having an elongated slit traversing at least the width of the wet object in the direction perpendicular to the transporting direction, the opposed surfaces of the nozzles being so inwardly oblique that the gap between the opposed surfaces is larger at the inner edge than the outer edge. The dry air from the air slit is discharged from the inside of the drying box to the outside along the oblique opposed surfaces, thus providing an air curtain to hermetically seal the drying box. The dry air flows on the opposed surfaces so as to expose the wet object to the dry air in the transporting direction for a relatively long time, compared with the conventional air slit, and therefore, the remaining water can be removed from the side faces of the wet object. The second dry air discharge means, therefore, attains both functions of providing an air curtain to seal the drying box and of removing the remaining water from the side faces of the wet object.

According to the present invention, the third dry air discharge means is directed at the means for moving the dry air discharge means rectilinearly. Thus, the third dry air discharge means can attain not only the loading of the drying box with dry air but also the cooling of the means for moving the dry air discharge means rectilinearly.

According to the present invention, the means for moving the dry air discharge means rectilinearly comprises a linear driving mechanism, which is simple in structure and small in size. Accordingly, the whole size of the drying apparatus can be significantly reduced. Also, the linear driving mechanism helps the dry air discharge means move smoothly and rectilinearly, thereby assuring that the wet object is completely dewatered and evenly dried.

BRIEF DESCRIPTION OF THE DRAWINGS

The present invention will now be described in detail with reference to the accompanying drawings, in which.

BEST MODE FOR CARRYING OUT THE INVENTION

Figure 1:
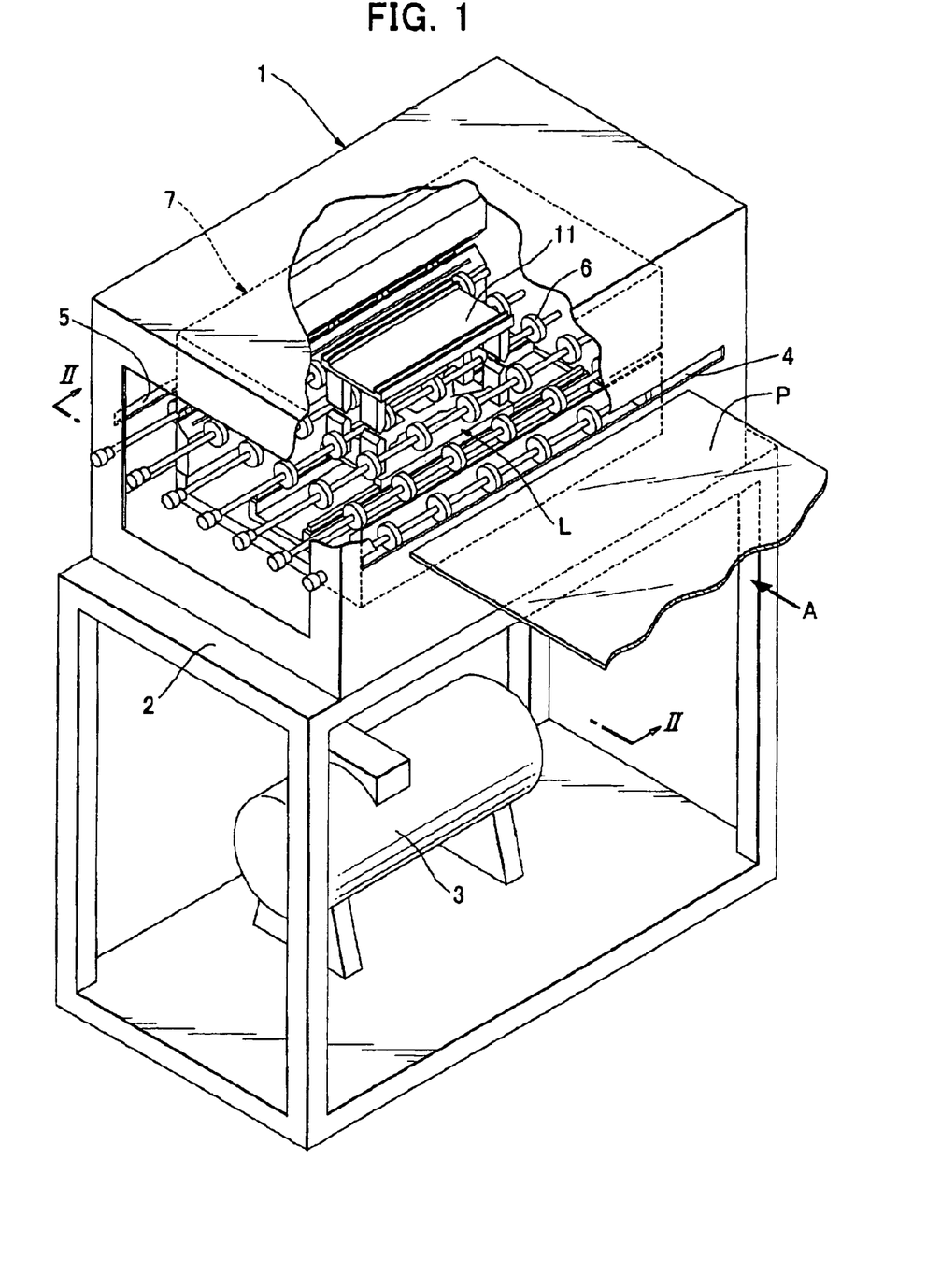
FIG. 1 is a perspective view of a drying apparatus according to one embodiment of the present invention.
Figure 2:
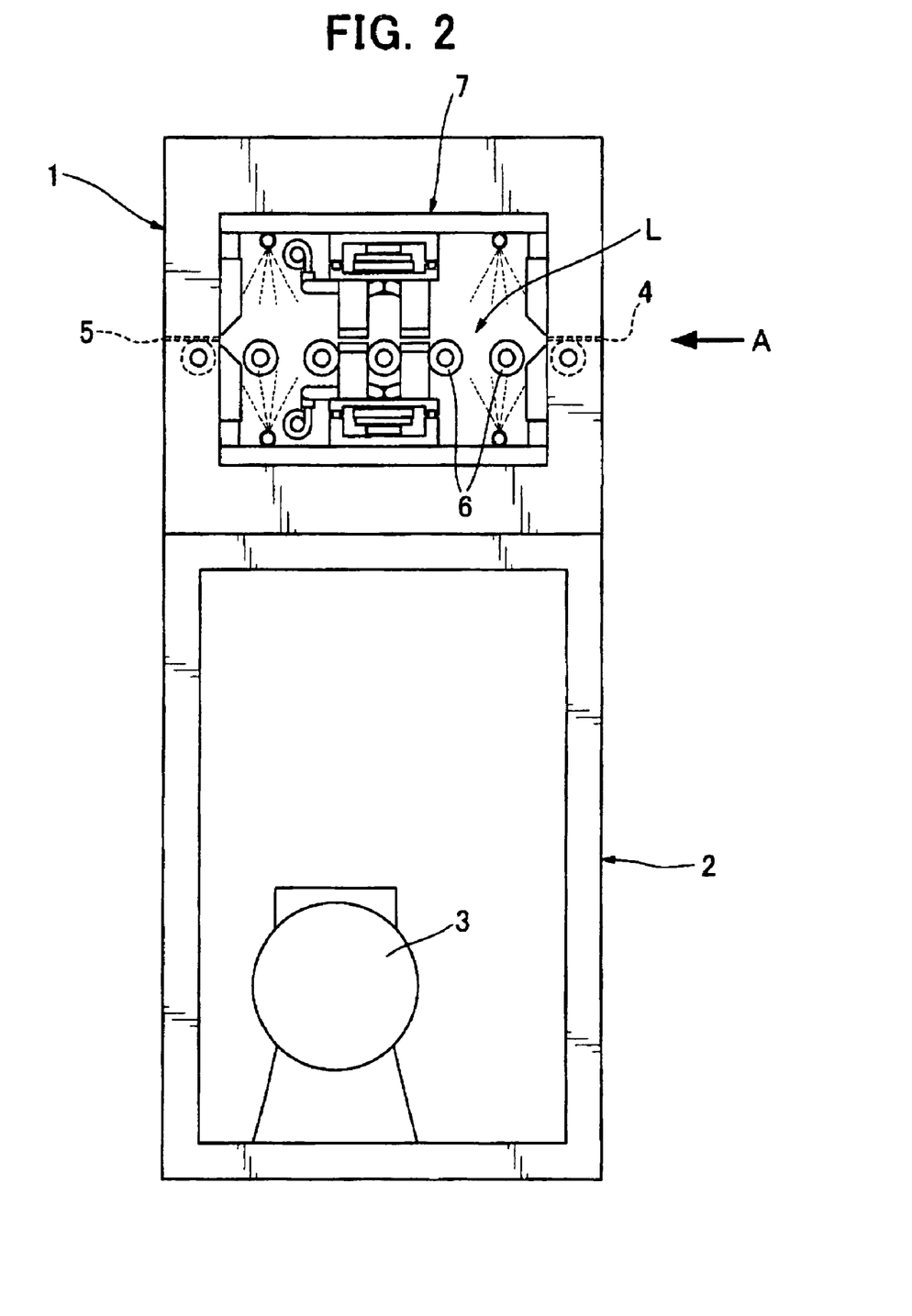
FIG. 2 shows a section of the drying apparatus as viewed in the direction indicated by arrows II-II in FIG. 1.

Now, a drying apparatus for use in drying wet objects after being washed with water according to one embodiment of the present invention will be described with reference to the accompanying drawings. FIG. 1 is a perspective view of the drying apparatus partly broken to show the inside. FIG. 2 shows a section of the drying apparatus as viewed in the direction indicated by arrows II-II in FIG. 1. As seen from these drawings, the drying apparatus body 1 is laid on a rest 2, and a tank 3 for supplying dry air to the drying apparatus body 1 is put on the floor of the rest 2. The drying apparatus body 1 has an entrance 4 and an exit 5 for a flat wet object (p) such as a liquid crystal panel or a printed circuit board to enter and leave the drying apparatus. A plurality of transport rolls 6 are arranged between the entrance 4 and the exit 5. These transport rolls are rotatably fixed to the shafts, which are borne by the drying apparatus body 1, thus providing transportation passage L for wet objects to be dried.

The drying apparatus body 1 has a drying box 7 installed therein. As seen from FIGS. 3, 4, 5 and 6, the drying box 7 is a hollow cuboid hermetically sealed except for its entrance 8 and exit 9, which are on the transportation passage L. The drying box 7 has a linear drive mechanism 10 mounted to each of the ceiling and floor of the drying box 7 (see FIG. 4), and each linear drive mechanism is loaded with a nozzle bracket 11. Thus, each linear mechanism drives the nozzle bracket 11 rectilinearly in the direction perpendicular to the direction in which the wet object is transferred (indicated by arrow A).

Figure 7:
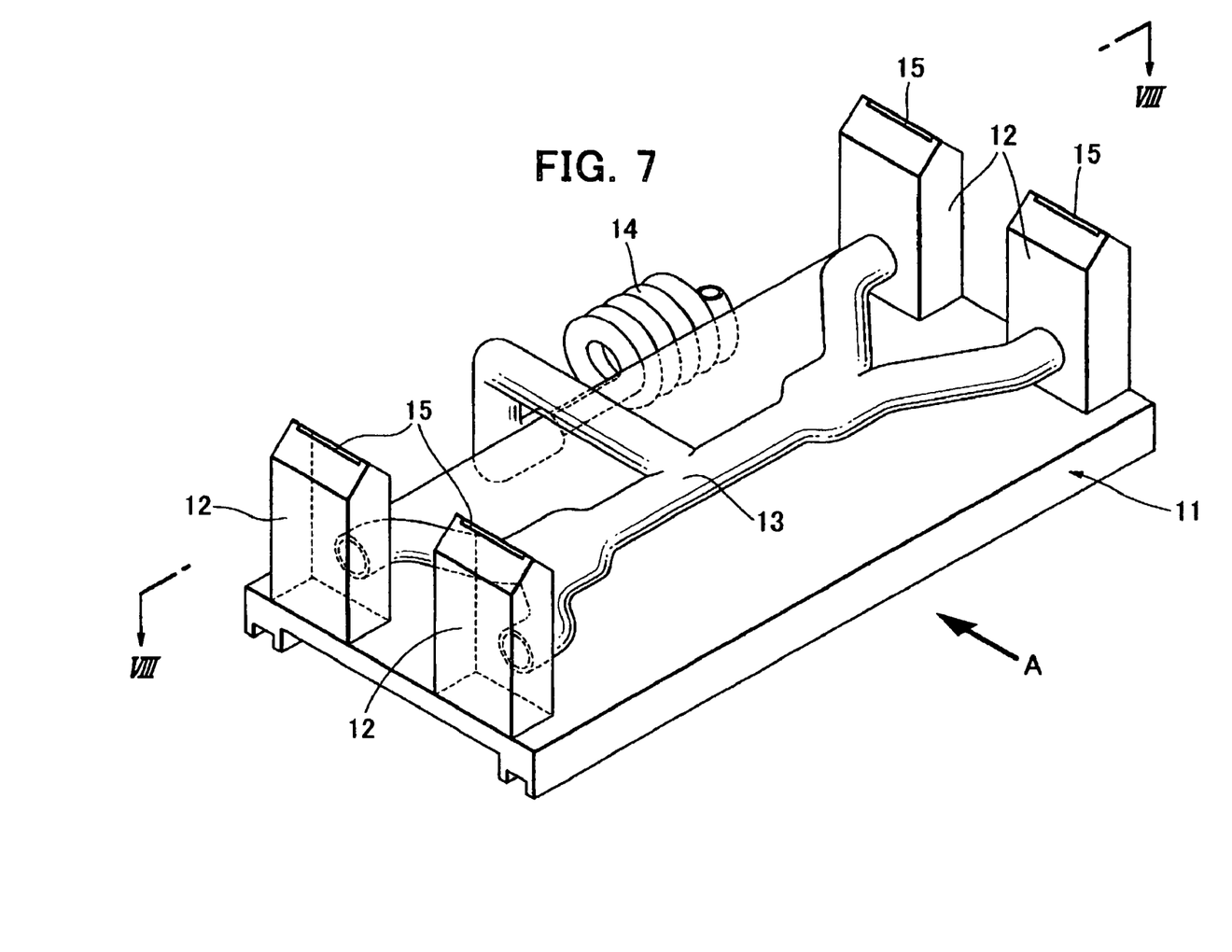
FIG. 7 is a perspective view of the nozzle bracket movable in the drying box.
Figure 8:
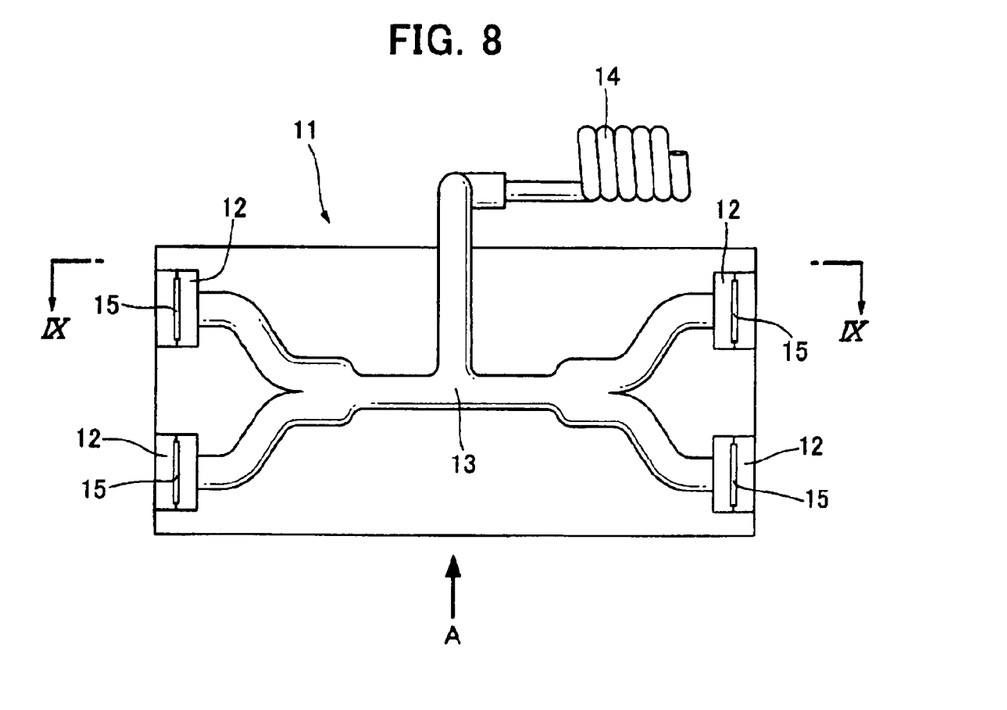
FIG. 8 shows a section of the nozzle bracket as viewed in the direction indicated by arrows VIII-VIII in FIG. 7.
Figure 9:
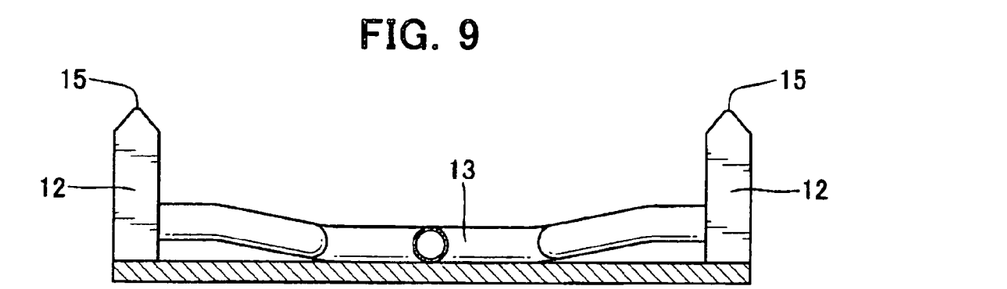
FIG. 9 shows a section of the nozzle bracket as viewed in the direction indicated by arrows IX-IX in FIG. 8.

As seen from FIGS. 7, 8 and 9, the nozzle bracket 11 has a spray nozzle 12 mounted onto each corner. All spray nozzles 12 are connected to the tank 3 via a distribution tube 13. The distribution tube 13 (partly omitted for the sake of simplicity in FIGS. 8 and 9) is used in delivering dry air from the tank 3 to each spray nozzle 12. In this particular embodiment, four spray nozzles 12 are used. The number of the spray nozzles used may be six, eight or more, and it can be one. A plurality of nozzle brackets 11 each having four spray nozzles may be joined with each other in the direction perpendicular to the direction in which the wet object is transferred.

Figure 5:
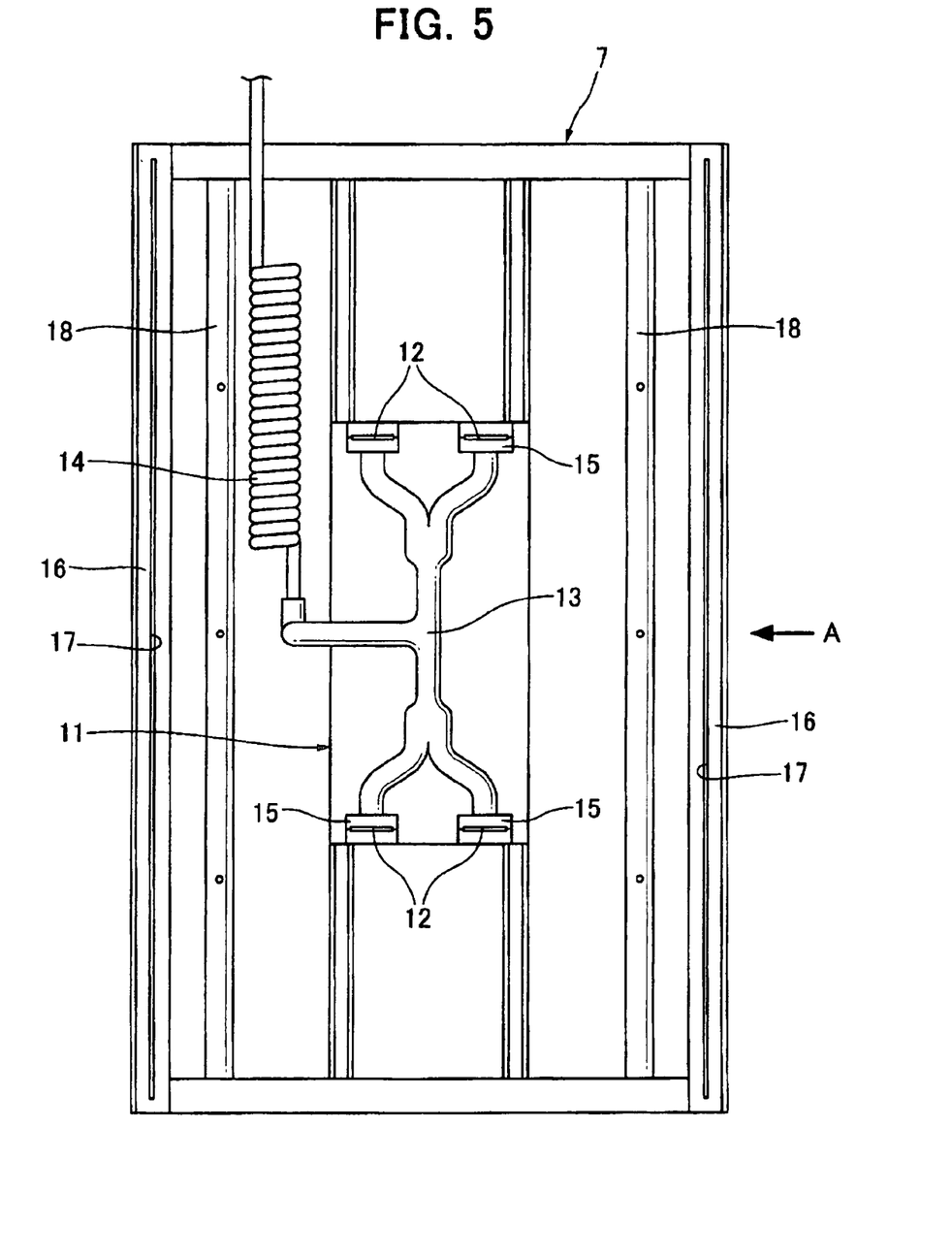
FIG. 5 shows a section of the drying box as viewed in the direction indicated by arrows V-V in FIG. 4.
Figure 6:
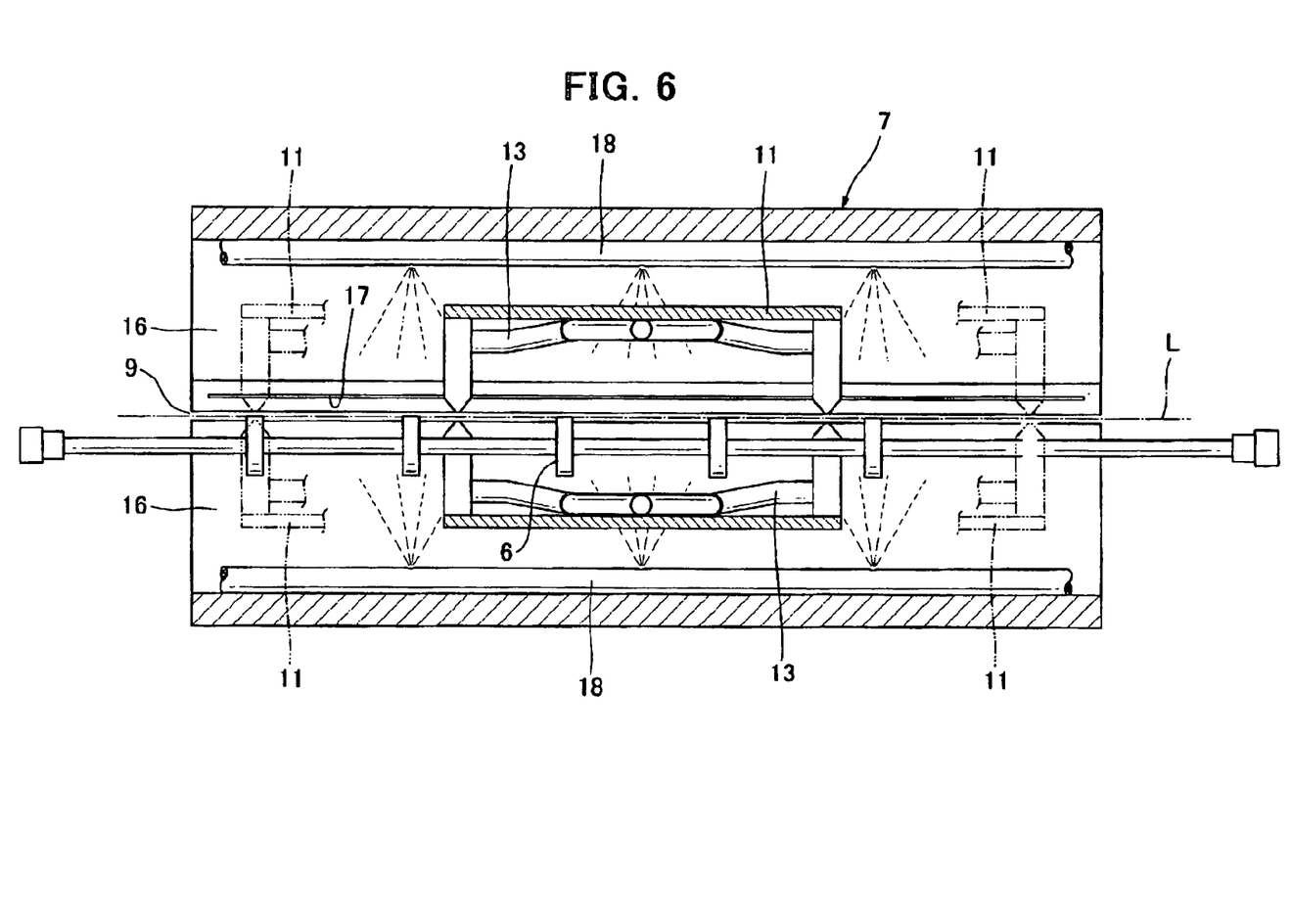
FIG. 6 is shows a section of the drying box as viewed in the direction indicated by arrows VI-VI in FIG. 4.

As shown in FIG. 6 (broken lines), the linear drive mechanism 10 drives the nozzle bracket 11 from side to side of the entrance 8 of the drying box 7, traversing the full width of the wet object. The distribution tube 13 is partly coiled as seen from FIG. 5, and the coiled section 14 permits the distribution tube 13 to follow the rectilinear movement of the nozzle bracket 11. Specifically, the coiled section 14 expands and shrinks to follow the rectilinear movement of the nozzle bracket 11, so that the smooth rectilinear movement of the nozzle bracket by the linear drive mechanism 10 may not hindered.

The spray nozzle 12 has a dry air discharge slit 15 on its tapered end. The dry air discharge slit 15 is elongated in the direction A in which the wet object is transferred. The dry air discharge slit 15 is about 15 mm long and about 0.1 mm wide (the width being the measurement taken in the direction perpendicular to the direction in which the wet object is transferred). The dry air discharge port of a conventional dry air spray nozzle is circular in shape, and is 0.1 to 0.2 mm in diameter. In contrast, the dry air discharge port of the dry air spray nozzle in the instant drying apparatus is a long narrow cut, which is long enough to expose the wet object to the dry air for so long a period that the remaining water is removed from the major opposite surfaces and the side faces of the wet object to completely dry the whole surface of the wet object.

Figure 3:
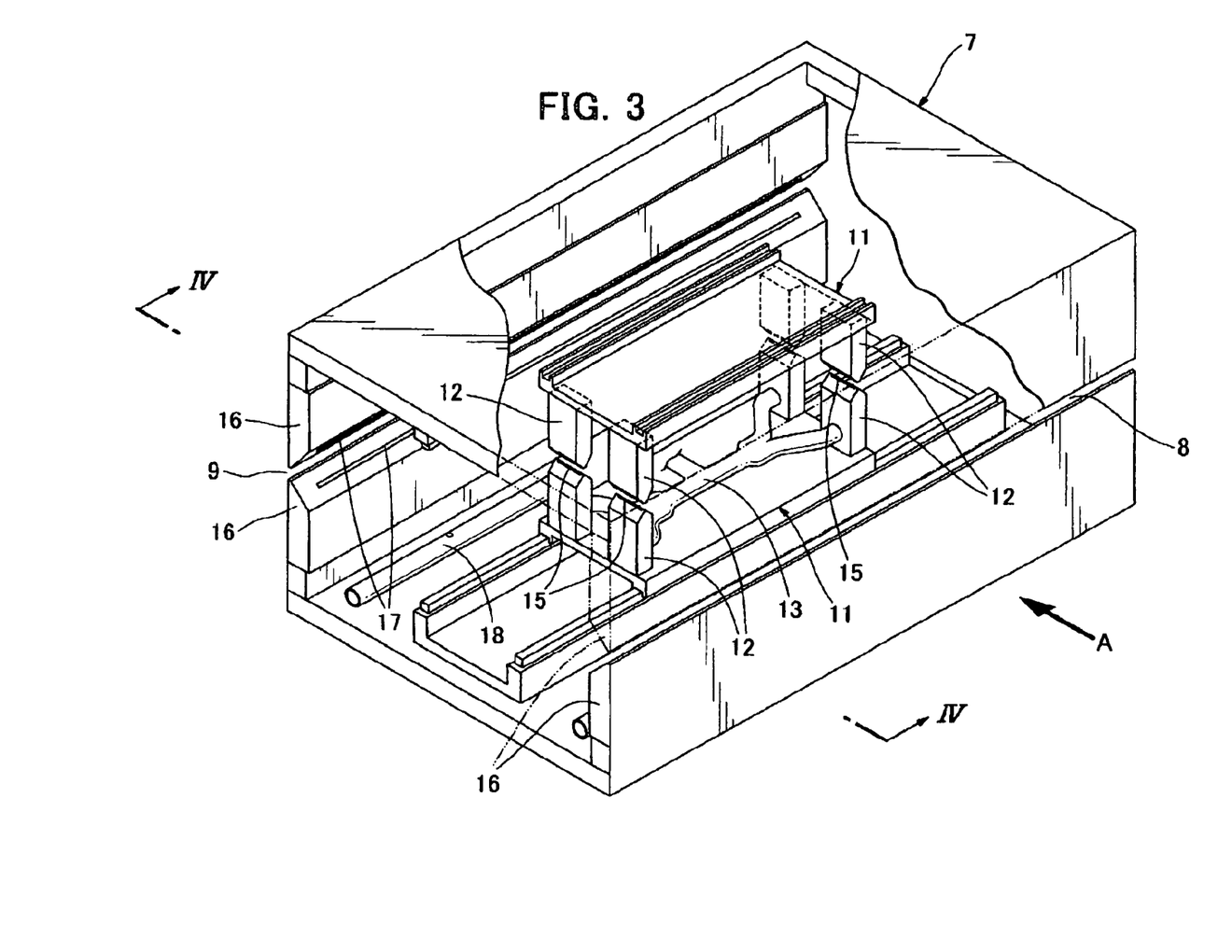
FIG. 3 is a perspective view of a drying box placed in the drying apparatus.
Figure 4:
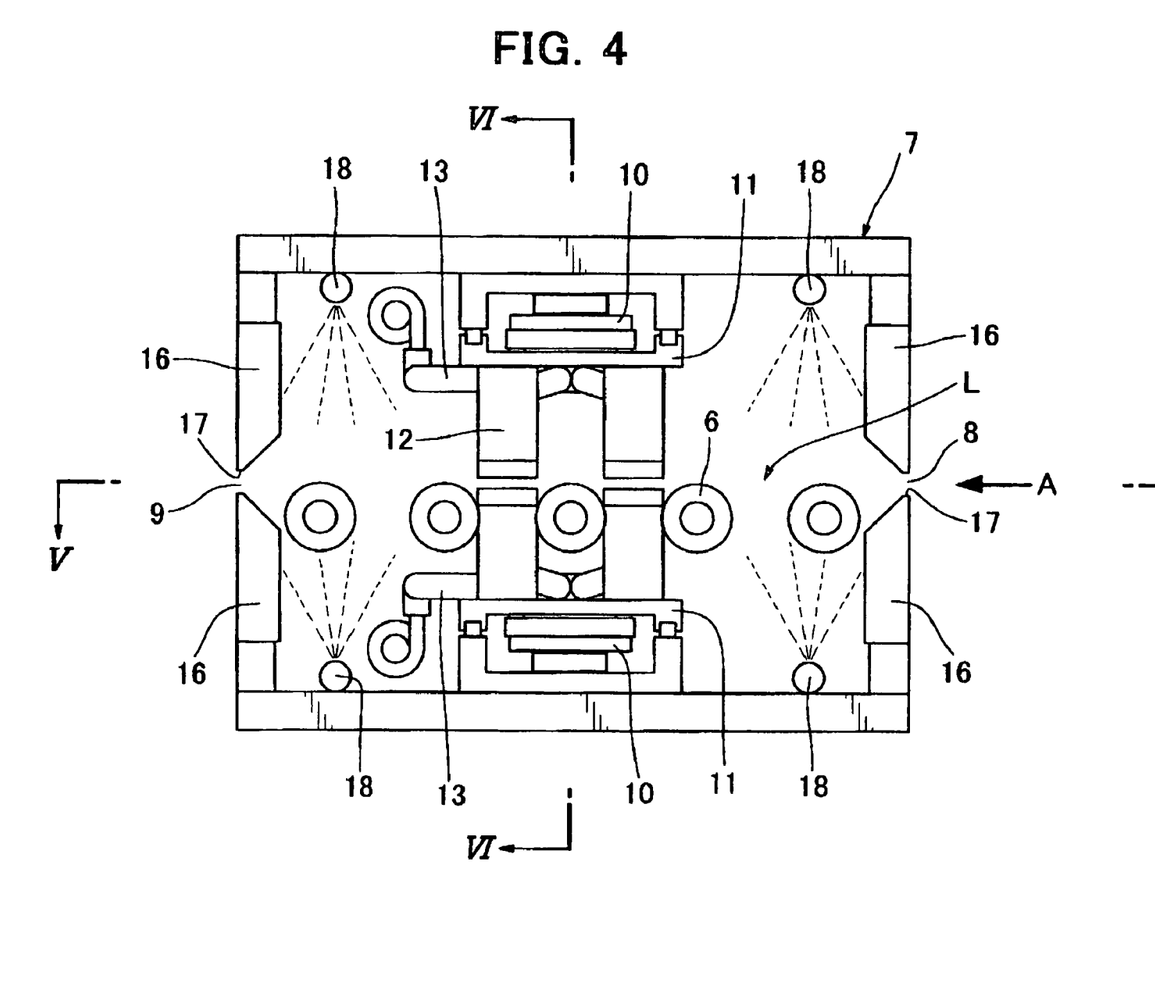
FIG. 4 shows a section of the drying box as viewed in the direction indicated by arrows IV-IV in FIG. 3.

As seen from FIGS. 3, 4 and 5, the transportation passage is sandwiched between opposed air curtain nozzles 16, which are mounted to each of the entrance 8 and exit 9 of the drying box 7. The opposed surfaces of the nozzles 16 are so inwardly oblique that the gap between the opposed surfaces is larger at the inner edge than the outer edge. Each nozzle has at the opposed surface an elongated slit 17 traversing the width of the entrance 8 or exit 9 in the direction perpendicular to the transporting direction A. The air curtain nozzles 16 are connected to the tank 3 as is the case with the spray nozzles 12, and dry air is supplied from the tank 3 to the air curtain nozzles 16. As the opposed surfaces, namely, the dry air discharge surfaces of the nozzles 16 are inwardly oblique as set forth above, the dry air from the air slit is discharged from the inside of the drying box 7 to the outside along the oblique opposed surfaces, thereby providing an air curtain to prevent the surrounding atmosphere from invading the inside of the drying box 7. Thus, the drying box 7 is hermetically sealed. As the dry air obliquely flows from the inside of the drying box 7 to the outside, the wet object is exposed to the dry air for so long a period that the remaining water can be removed from the side faces of the wet object. The air curtain nozzles 16, therefore, have a dewatering function, too.

As shown in FIGS. 4, 5 and 6, the spray nozzles 18 are mounted on the ceiling and floor of the drying box in the vicinities of the entrance 8 and exit 9 to fill the drying box 7 with dry air. Each air-loading spray nozzle 18 has three dry air discharge slits, and therefore, the four spray nozzles provide twelve air discharge slits in total. As is the case with the spray nozzle 12, each air-loading spray nozzle is supplied with dry air by the tank. The air-loading spray nozzle 18 is larger in diameter than the spray nozzle 12. All air-loading spray nozzles discharge dry air to quickly fill the drying box 7 with dry air.

FIGS. 4, 5 and 6 show the air-loading spray nozzle as being directed to the inside of the drying box 7, but they may be directed at the heat generating portion of each linear drive mechanism. Then, the air-loading spray nozzle has a function of cooling the linear drive mechanism, too.

I claim:

1. A drying apparatus comprising:
 a hermetically sealed drying box positioned in a transportation passage on which a wet object is transferred after being washed with a liquid, the drying box having an entrance and an exit to allow the wet object to enter and leave the drying box;
 a first dry air discharge means for blowing and directing dry air at the wet object traveling on the transportation passage; and
 means for moving the first dry air discharge means rectilinearly in a direction parallel to the surface of the wet object and perpendicular to a transporting direction in which the wet object is transferred at the same time that the wet object is being transported through the drying box,
 wherein the means for moving the first dry air discharge means comprises a nozzle bracket having transverse ends spaced apart from one another, and
 wherein the first dry air discharge means comprise a plurality of spray nozzles mounted to the transverse ends of the nozzle bracket and comprising a discharge port in the form of an elongated slit extending in the transporting direction.

2. The drying apparatus according to claim 1, wherein the plurality of spray nozzles are arranged in line in a direction perpendicular to the transporting direction.

3. The drying apparatus according to claim 1, wherein the plurality of spray nozzles comprise a plurality of arrays of spray nozzles arranged in the transporting direction, each of the plurality of arrays of spray nozzles comprising a plurality of spray nozzles arranged in line in a direction perpendicular to the transporting direction.

4. The drying apparatus according to claim 1, wherein the first dry air discharge means are arranged above and below the wet object on the transportation passage to sandwich the wet object therebetween.

5. The drying apparatus according to claim 1, further comprising a second dry air discharge means positioned at the entrance and the exit of the drying box, wherein the second dry air discharge means comprise a pair of opposed nozzles each having an elongated slit traversing at least a width of the wet object in a direction perpendicular to the transporting direction.

6. The drying apparatus according to claim 5, wherein the pair of opposed nozzles have opposed surfaces so inwardly oblique that a gap between the opposed surfaces is larger at an inner edge than an outer edge.

7. The drying apparatus according to claim 5, further comprising a third dry air discharge means to fill the drying box with dry air, wherein the third dry air discharge means have a discharge port directed at the means for moving the first dry air discharge means rectilinearly.

8. The drying apparatus according to claim 1, wherein the means for moving the dry air discharge means rectilinearly comprises a linear driving mechanism.

* * * * *